United States Patent [19]
Bouygues et al.

[11] 3,950,095
[45] Apr. 13, 1976

[54] POSITIONING DEVICE FOR A FLAT RECTANGULAR WORKPIECE

[75] Inventors: Jean Bouygues; René Gerard, both of Paris, France

[73] Assignee: Thomson-CSF, Paris, France

[22] Filed: Feb. 13, 1974

[21] Appl. No.: 441,968

[30] Foreign Application Priority Data
Feb. 16, 1973  France .............................. 73.05560

[52] U.S. Cl. ............. 355/72; 29/203 P; 33/174 TA; 118/503; 219/121 L; 269/20; 269/89; 269/97; 269/107; 269/156; 269/296; 269/319; 269/321 H; 354/4; 355/53
[51] Int. Cl.² ....................................... G03B 27/58
[58] Field of Search ............. 355/42, 43, 46, 78, 79, 355/72–76, 53, 54, 86, 95, 132, 133; 354/123, 124, 4, 76; 269/71–73, 89, 91, 97, 107, 317, 316, 319, 321 H, 321 WE, 20, 21, 24, 156, 296–298; 33/1 M, 174 TA, 184.5; 219/121 L, 121 LM; 356/244, 171, 172; 250/471, 468; 118/503, 500; 235/151 PL, 151.1, 151.11; 29/203 P, 203 B

[56] References Cited
UNITED STATES PATENTS

| | | | |
|---|---|---|---|
| 2,974,579 | 3/1961 | Echelson et al. ...................... 355/95 |
| 3,563,468 | 2/1971 | Baggaley et al. ................... 355/53 X |
| 3,752,589 | 8/1973 | Kobayashi ........................... 356/172 |
| 3,775,644 | 11/1973 | Cotner et al. ............. 269/321 WE X |
| 3,809,860 | 5/1974 | Diepeveen ............... 269/321 WE X |
| 3,858,982 | 1/1975 | Meckler .......................... 356/171 X |

OTHER PUBLICATIONS
"Wafer Holder," IBM Technical Disclosure Bulletin; Dec., 1970, p. 1791.
"Mask-to-Mask Alignment and Copying," IBM Technical Disclosure Bulletin; Nov., 1973, p. 1977.
"Wafer Position," IBM Technical Disclosure Bulletin, May, 1975, p. 3577.

*Primary Examiner*—L. T. Hix
*Assistant Examiner*—Kenneth C. Hutchison
*Attorney, Agent, or Firm*—Karl F. Ross; Herbert Dubno

[57] ABSTRACT

A flat rectangular workpiece, such as a photographic plate in a photo-repeating apparatus designed to produce integrated-circuit masks, laterally overhangs a platform of a carriage which is slidable on a mobile supporting table. The platform has two end stops and a side stop defining the relative position of the workpiece thereon, the overhanging edges of the workpiece entering between upper and lower jaws of three grippers — one on one side and two on the other — when the carriage is slid into a working position. The lower gripper jaws, constituted by spring-loaded plungers normally held down by suction, are then released to lift the workpiece off the platform while clamping it against the overlying upper jaws. Manual retraction of a stop screw, bearing upon a fixed abutment on the supporting table, causes a limited further advance of the carriage under the force of a carriage-borne magnet coacting with the abutment; this movement results in withdrawal of the side stop, through a camming mechanism, even as the end stops disengage the clamped workpiece so that the latter thereafter has no contact with the carriage.

11 Claims, 4 Drawing Figures

POSITIONING DEVICE FOR A FLAT RECTANGULAR WORKPIECE

FIELD OF THE INVENTION

The present invention relates to a device for operatively positioning a flat rectangular workpiece on a mobile table, constituting a reference trihedral system designed to align the workpiece with a perpendicular axis. The workpiece may be, for example, a photographic plate to be illuminated through an objective in line with that axis.

BACKGROUND OF THE INVENTION

A problem of rapid and accurate positioning arises when it is desired to place a photographic plate in a working position on a system of mobile tables with cross-feed motions. These tables are utilized, for example, in photographic reproduction apparatus such as a photo-repeater, i.e. a machine for the multiple reproduction of integrated-circuit masks. In an apparatus of this kind, the tables, in moving, are to remain parallel to a fixed (usually horizontal) reference plane. The reference trihedral system is here represented by the optical axis of the apparatus and by a system of rectangular coordinates located in the plane of one face of one of the mobile tables (perpendicular to the optical axis). The desired precision, in the case of integrated circuits, is on the order of one micron.

The known solutions to the problem of precise guidance can be split into two main categories:

1. Direct positioning of the workpiece upon the top face of a mobile table. The photographic plate is then immobilized by simple stops. Under these circumstances, it is the bottom face of the plate, resting on the mobile tables, which constitutes a reference plane. However, the parallelism of the faces is only approximate in the plates currently used: the photosensitive film on top will therefore not be parallel to the reference plane within one micron, in the manner which the technology of integrated circuits requires. It will therefore be necessary in this case to utilize specially manufactured plates, which do have this degree of accuracy, and this constitutes a drawback.

2. Positioning through the medium of a plate-holder frame. The photographic plate is then immobilized by supporting its top face, that is to say the photosensitive film, against the edges of that frame bounding the plate. The plate is permanently subjected to an upward supporting force, for example by means of a leaf spring applied against its center. In this solution, even if the frame is designed with sufficient accuracy to ensure parallelism of the edges with the reference plane, there will be a slight distortion of the plate under the effect of the supporting force, so that a positional error, substantially in excess of one micron at the center thereof, will generally occur.

Finally, a common drawback to both the aforementioned solutions arises in the quite general case where the plate, or the plate-holding frame, rests against simple stops attached to a mobile table so as to shift inertially if the moving table executes sudden displacements. Naturally, these movements could be inhibited by employing a system of elastic stops but, because of the stress produced in the section of the plate, distortion of the latter is inevitable.

OBJECT OF THE INVENTION

The object of our invention is to provide an improved positioning device for the purpose set forth which overcomes the aforestated drawbacks.

SUMMARY OF THE INVENTION

In accordance with this invention, we provide a support such as a table orthogonally shiftable on a base whereon a carriage is movably mounted for displacing a workpiece between a handling position, serving for loading and unloading, and a working position as discussed above. The carriage, which is narrower than the workpiece, is provided with stop means defining a relative position in which two opposite lateral workpiece edges overhang the carriage, specifically a platform thereof provided with resilient pad means for the support of the workpiece. Upon an advance of the loaded carriage into the working position, the overhanging workpiece edges enter between upper and lower jaws of gripper means, preferably two longitudinally spaced grippers on one side and a single gripper on the other side of the carriage designed to give three-point support to the workpiece. The vertically movable lower jaws, which may be constituted by spring-loaded plungers as described hereinafter, can then be operated to lift the workpiece off the carriage platform and to clamp its overhanging edges against the overlying fixed upper jaws. Upon such clamping, pursuant to another feature of our invention, the stop means can be disengaged from the workpiece by a mechanism which may include coacting elements on the carriage and on the support, such as a spring-loaded lever and a pin, for laterally displacing a side stop during a further advance of the carriage, that advance simultaneously moving two transversely spaced end stops on the carriage out of contact with another workpiece edge so that the clamped workpiece now is clear of the carriage.

BRIEF DESCRIPTION OF THE DRAWING

The invention will be better understood and other of its features rendered apparent from a consideration of the ensuing description and the accompanying drawing in which.

SPECIFIC DESCRIPTION

Figure 1:
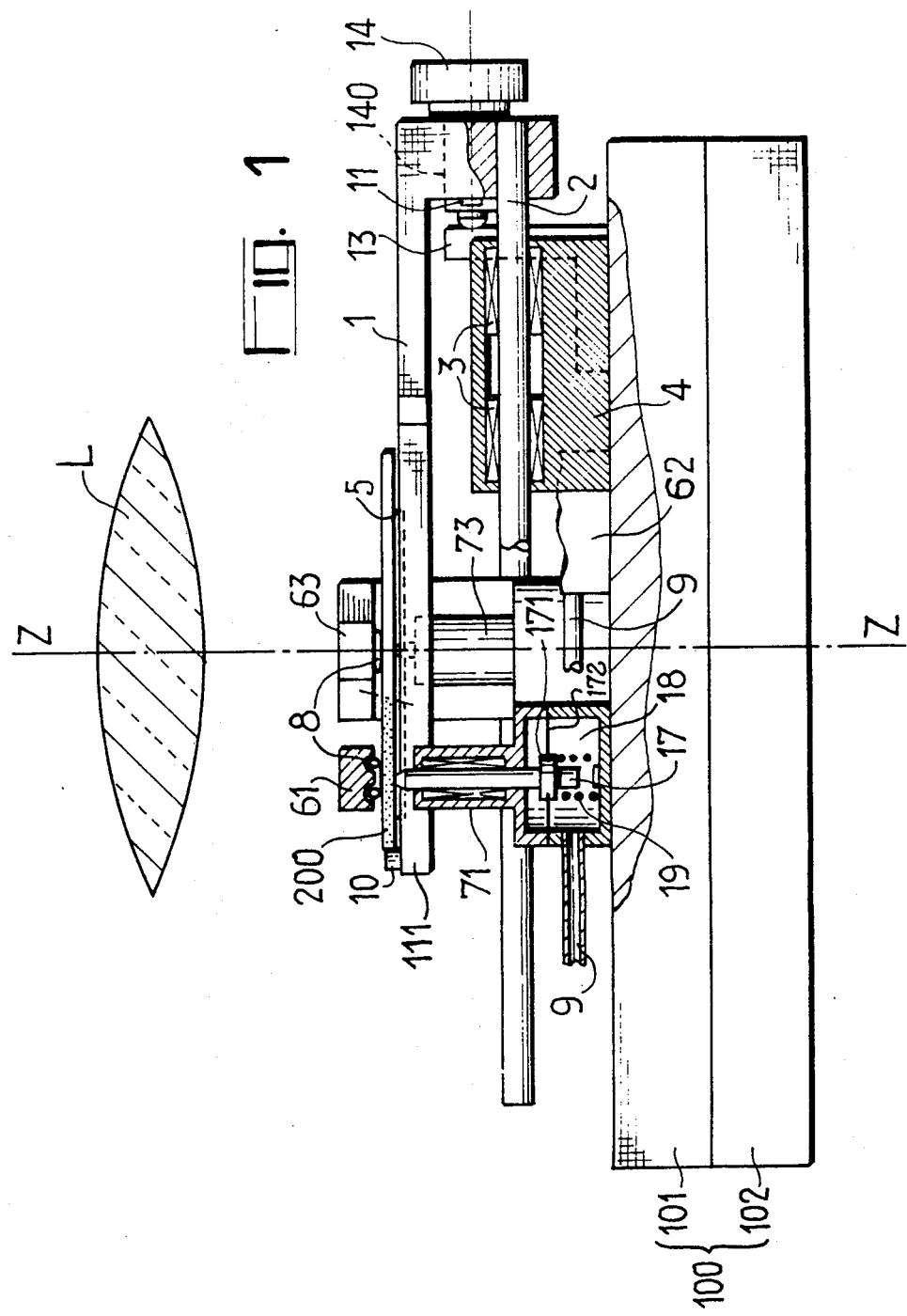
FIG. 1 is a section through a device in accordance with the invention, the section being successively taken in two parallel planes on the line I—I of FIG. 2.
Figure 2:
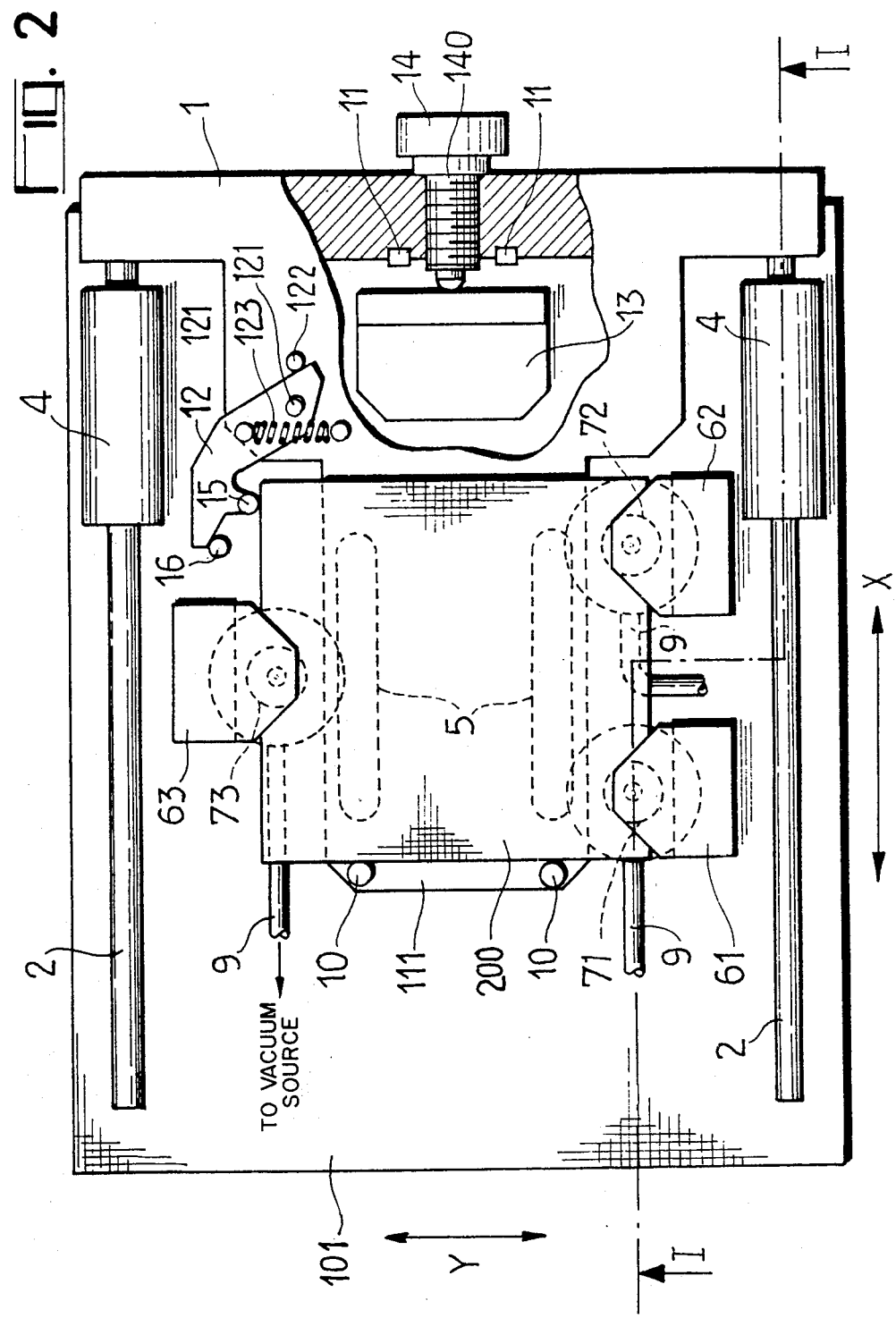
FIG. 2 is a plan view of the device shown in FIG. 1.
Figure 3:
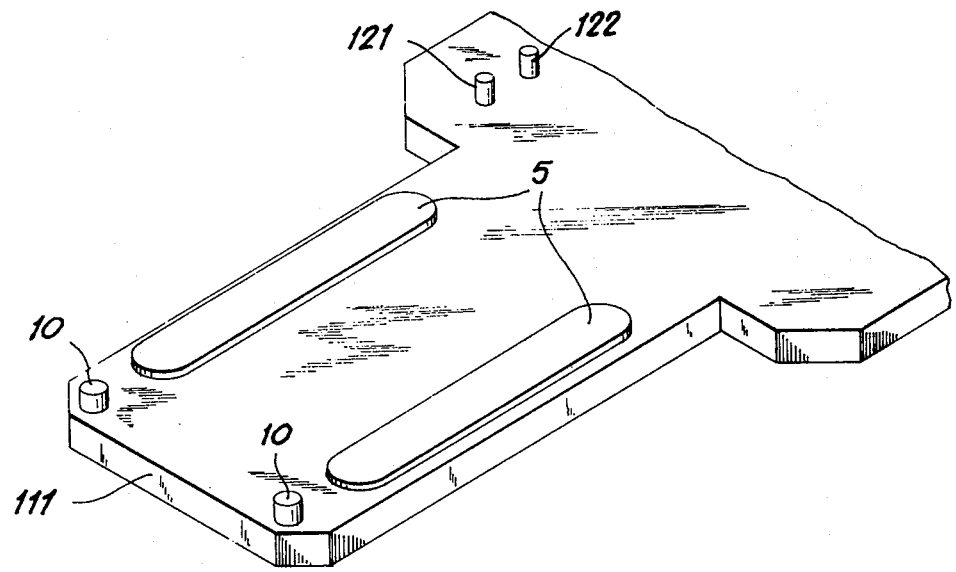
FIGS. 3 and 4 are perspective detail views.

FIG. 1 schematically illustrates an assembly 100 of tables with cross-feed movements, comprising a top table 101 and a bottom table 102, associated with a photographic reproduction apparatus of the "photo repeater" kind. In FIG. 2, in which only the table 101 is visible, we have indicated at X, Y two directions of displacement to either side of a mean position. In this latter position, the center of the assembly 100 is aligned with an optical axis ZZ of an objective constituted by a system of lenses diagrammatically indicated at L. Such a cross-feed movement has been described in commonly owned U.S. Pat. No. 3,692,413.

On the table 101, a carriage 1 can slide by means of two rods 2 guided in mountings 4 each comprising two ball bearings 3 of the helical-race kind. The carriage comprises a platform 111 designed to accommodate a photographic plate 200. It can assume a working position, shown in FIGS. 1 and 2, in which the platform 111 and the plate 200 are arranged beneath the objective L and centered on the optical axis ZZ. It can be slid to the right into a handling position in order to give access to the platform 111 for loading and unloading.

An L-shaped bracket 13 of magnetically permeable metal fixedly rises from the table 101 and coacts with a magnet 11 attached to a transverse surface of carriage 1 spacedly confronting an abutment surface of the bracket in the illustrated position. The bracket is attached by one of its limbs to the table 101 whereas its other, vertical limb is of sufficient height to stop the carriage 1 in the working position. This position is adjustable by means of a knob 14 controlling a screw 140 passing through the magnet 11 which latter is of toroidal form. The rounded tip of the screw 140 is drawn toward the bracket 13 under the effect of the attractive force exerted by the magnet 11.

The photographic plate 200, previously deposited upon the platform 111 in the handling position, rests upon two rubber pads 5 (FIG. 2) rising above the platform 111. The plate 200 is positioned on the platform, with a preliminary accuracy of the order of one millimeter, by being placed against three stops engaging the plate from the left and from above as viewed in FIG. 2. Two of these stops are studs 10 of cylindrical form with vertical axes, fixed in transversely spaced positions at one end of the platform 111 opposite the knob 14.

The third stop, constituted by a roller 15, is carried by a lever 12 pivoting about a pin 121 fixed to the carriage 1. In the handling position, the lever is urged against a stud 122 on platform 111 by the action of a spring 123 attached to the carriage 1 and to this lever. In the working position, the side stop constituted by the roller 15 can be withdrawn by turning the knob 14 so as to retract the screw 140 from its illustrated extended position. This retraction allows the magnet 11 to pull the carriage 1 further to the left whereby a pin 16, rising from the table 101, cammingly engages a projecting extremity of lever 12 to swing same clockwise about its fulcrum 121 with resulting upward movement of roller 15 as viewed in FIG. 2.

Figure 4:
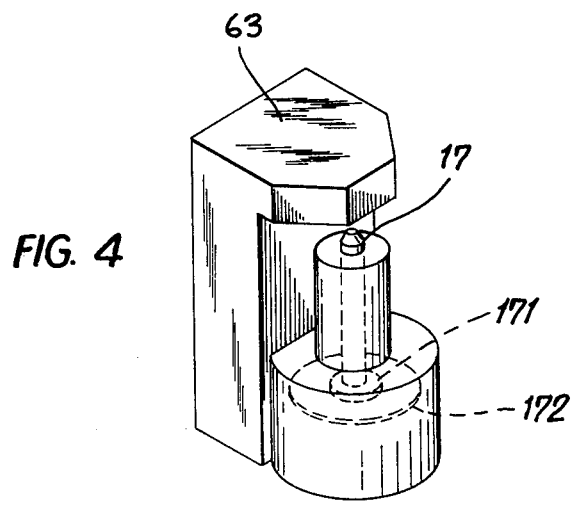

The table 101 also carries three grippers comprising fixedly positioned upper jaws 61, 62, 63, which overlie the lateral edges of plate 200 projecting beyond platform 111, and lower jaws including plungers 17 (only one shown) vertically guided in respective blocks 71, 72, 73. As also illustrated for the jaw 63 in FIG. 4, the lower end of each plunger 17 is enlarged to form a collar 171 secured to a horizontal membrane 172 which, acting as a piston head, closes a vacuum chamber 18 in the bottom part of the respective guide block. A coil spring 19 in chamber 18, bearing upon collar 171, urges the plunger 17 upwardly toward the associated upper jae whose underside is provided with a rubber bumper 8. Chamber 18 is connected via a conduit 9 to a nonillustrated source of vacuum adapted to apply suction thereto for drawing the plunger down, against its spring force, into an unclamping position. Release of the vacuum in chamber 18 results in an upward movement of the plunger, lifting the plate 200 off the platform 111 and clamping its overhanging lateral edges against jaws 61, 62, 63.

The operation of the device is as follows: With the carriage 1 in the handling position, the screw 140, by means of the knob 14, is extended so as to project beyond the magnet 11. Then, suction is applied to the chamber 18 of each gripper to retract the plunger 17 thereof. The platform 111 is then loaded with a photographic plate 200. After the loaded carriage has been advanced leftward into the working position, conduits 9 are vented to the atmosphere to release the plungers 17; the photographic plate is then clamped by the three grippers. The retraction of screw 140 lets the carriage 1 move further to the left until the abutment 13 bears against the magnet 11; this motion releases the plate 200 from the end and side stops 10 and 15. After exposure of the photographic plate, the same operations take place in the reverse order.

Amongst the advantages possessed by the device in accordance with the invention, the following can be listed:

1. The stability of positioning of the photographic plate, despite the mobility of the supporting system 100, by the firm clamping of the plate during the operation of the photo repeater in the three lateral grippers which are independent of the carriage.

2. The absence of any distortion of the plate, which is subjected only to stresses perpendicular to its plane at the grippers and is disengaged from the carriage-borne stops during exposure.

3. The independence of the working position of the photographic plate from possible defects in the platform 111, in particular lack of parallelism between it and the top face of the table 101.

The invention is applicable to any device requiring extremely high accuracy of positioning of a flat workpiece which is to be displaced beneath a radiation source in, for example:

a photo-optical or electron-optical apparatus;
an ion-machining or ion-implantation apparatus; or
laser-beam-machining apparatus.

What we claim is:

1. A device for operatively positioning a flat rectangular workpiece, comprising:
   a support;
   a carriage movably mounted on said support for displacing a workpiece between a handling position and a working position, said carriage being narrower than the workpiece and being provided with stop means defining a relative position in which two opposite lateral workpiece edges overhang the carriage; and
   gripper means rising from said support on opposite sides of said carriage for engagement with the overhanging workpiece edges upon an advance of the carriage into said working position, said gripper means having fixed upper jaws overlying said workpiece edges in said working position and vertically movable lower jaws for lifting the workpiece off said carriage and clamping said overhanging edges against said upper jaws.

2. A device as defined in claim 1, further comprising mechanism for disengaging said stop means from the workpiece upon a clamping thereof by said gripper means.

3. A device as defined in claim 2 wherein said stop means comprises end-stop means fixed to said carriage and side-stops means movable with reference to said carriage, said mechanism including coacting elements on said carriage and said support for laterally displacing said side-stop means upon a further advance of said carriage beyond said working position to disengage said end-stop means from the workpiece.

4. A device as defined in claim 3 wherein said support is provided with a fixed abutment having a transverse surface which spacedly confronts a transverse surface of said carriage in said working position, further comprising magnet means on one of said transverse surfaces tending to draw said carriage and said abutment toward each other, and a retractable stop member on said carriage engaging said abutment in said working position for temporarily halting the advance of the carriage.

5. A device as defined in claim 3 wherein said coacting elements include a pin rising from said support and a spring-loaded lever on said carriage cammable by said pin against its spring force, said side-stop means being part of said lever.

6. A device as defined in claim 5 wherein said carriage is provided with a platform supporting said lever, said end-stop means comprising a pair of studs transversely spaced on said platform.

7. A device as defined in claim 6 wherein said platform is provided with resilient pad means for supporting the workpiece during movement into and out of said working position.

8. A device as defined in claim 2 wherein said gripper means comprises two longitudinally spaced grippers on one side of said carriage and a single gripper on the other side thereof.

9. A device as defined in claim 8 wherein said lower jaws are upwardly spring-biased plungers provided with downwardly effective retraction means.

10. A device as defined in claim 9 wherein said plungers terminate in piston heads, said retraction means comprising vacuum chambers bounded by said piston heads and a source of suction connectable to said vacuum chambers.

11. A device as defined in claim 2 wherein said support comprises a mobile table orthogonally displaceable on a base.

* * * * *